United States Patent
Zhao et al.

(10) Patent No.: US 9,431,218 B2
(45) Date of Patent: Aug. 30, 2016

(54) SCALABLE AND UNIFORMITY CONTROLLABLE DIFFUSION PLASMA SOURCE

(71) Applicant: Tokyo Electron Limited, Minato-ku, Tokyo (JP)

(72) Inventors: Jianping Zhao, Austin, TX (US); Lee Chen, Cedar Creek, TX (US); Radha Sundararajan, Dripping Springs, TX (US); Merritt Funk, Austin, TX (US)

(73) Assignee: TOKYO ELECTRON LIMITED, Tokyo (JP)

(*) Notice: Subject to any disclaimer, the term of this patent is extended or adjusted under 35 U.S.C. 154(b) by 118 days.

(21) Appl. No.: 14/209,695

(22) Filed: Mar. 13, 2014

(65) Prior Publication Data

US 2014/0265846 A1 Sep. 18, 2014

Related U.S. Application Data

(60) Provisional application No. 61/790,372, filed on Mar. 15, 2013.

(51) Int. Cl.
*H05B 39/00* (2006.01)
*H01J 37/32* (2006.01)

(52) U.S. Cl.
CPC .... *H01J 37/32357* (2013.01); *H01J 37/32422* (2013.01); *H01J 37/32596* (2013.01)

(58) Field of Classification Search
CPC . H01L 21/263; H05H 1/46; H01J 37/32357; C23F 1/00; H01F 41/0616
USPC ....... 315/98, 34, 39, 111.21, 111.81, 111.31, 315/111.41, 111.51, 111.61, 111.71, 315/111.91; 438/795, 798, 726; 216/67, 69, 216/68; 134/1.1; 156/345.33, 345.36, 156/345.41, 345.1, 345.24, 345.29; 427/569; 250/492.1, 492.3
See application file for complete search history.

(56) References Cited

U.S. PATENT DOCUMENTS

| | | | |
|---|---|---|---|
| 4,824,544 A | 4/1989 | Mikalesen et al. | |
| 5,133,986 A | 7/1992 | Blum et al. | |
| 5,560,779 A * | 10/1996 | Knowles | C23C 16/276 118/715 |
| 5,627,435 A | 5/1997 | Jansen et al. | |
| 6,445,670 B1 * | 9/2002 | Oshima | G11B 7/126 369/116 |
| 6,603,091 B2 | 8/2003 | Hsu et al. | |
| 6,899,054 B1 | 5/2005 | Bardos et al. | |
| 7,096,819 B2 * | 8/2006 | Chen | H01J 37/32174 118/723 I |
| 7,411,352 B2 | 8/2008 | Madocks | |

(Continued)

*Primary Examiner* — Lincoln Donovan
*Assistant Examiner* — Thomas Skibinski
(74) *Attorney, Agent, or Firm* — Rothwell, Figg, Ernst & Manbeck, P.C.

(57) ABSTRACT

A method of treating a substrate with plasma is described. In particular, the method includes disposing a substrate in a plasma processing system, disposing a hollow cathode plasma source including at least one hollow cathode within the plasma processing system, and disposing a grid between the cathode outlet of the plurality of hollow cathodes and the substrate. The method further includes electrically coupling the grid to electrical ground, coupling a voltage to the at least one hollow cathode relative to electrical ground, and generating plasma in hollow cathode by ion-induced secondary electron emission of energetic electrons that move along a first trajectory, and diffusing lower energy electrons along a second trajectory across a first region of the interior space between the cathode outlet and the grid, through the grid, and into a second region of the interior space in fluid contact with the substrate.

15 Claims, 2 Drawing Sheets

(56) References Cited

U.S. PATENT DOCUMENTS

| | | |
|---|---|---|
| 7,976,674 B2 | 7/2011 | Brcka |
| 8,033,884 B2 | 10/2011 | Rueger et al. |
| 2001/0020477 A1 | 9/2001 | Hsu et al. |
| 2002/0000779 A1* | 1/2002 | Anders ............. H01J 37/32009 315/111.21 |
| 2002/0025681 A1 | 2/2002 | Chi et al. |
| 2006/0208649 A1* | 9/2006 | Rueger ............. H01J 37/32366 315/111.21 |
| 2007/0017636 A1 | 1/2007 | Goto et al. |
| 2009/0022908 A1 | 1/2009 | Yang et al. |
| 2009/0084501 A1 | 4/2009 | Chen et al. |
| 2009/0218212 A1 | 9/2009 | Denpoh et al. |
| 2010/0006226 A1* | 1/2010 | Cho .................. H01J 37/32009 156/345.33 |
| 2010/0025371 A1 | 2/2010 | Cho et al. |
| 2011/0212624 A1 | 9/2011 | Hudson |
| 2012/0037597 A1 | 2/2012 | Koshimizu et al. |
| 2012/0258607 A1 | 10/2012 | Holland et al. |
| 2014/0037865 A1 | 2/2014 | Butcher |

* cited by examiner

SCALABLE AND UNIFORMITY CONTROLLABLE DIFFUSION PLASMA SOURCE

CROSS-REFERENCE TO RELATED APPLICATIONS

Pursuant to 37 C.F.R. §1.78(a)(4), this application claims the benefit of and priority to U.S. Provisional Application No. 61/790,372, filed on Mar. 15, 2013, which is expressly incorporated by reference herein in its entirety.

BACKGROUND OF THE INVENTION

1. Field of Invention

The invention relates to a method for processing a substrate with plasma.

2. Description of Related Art

In semiconductor manufacturing, the complexity of devices formed on semiconductor substrates continues to increase at a rapid pace, while the size of features, such as transistor gates, continues to decrease towards the 10 and 7 nanometer (nm) technology nodes. Moreover, the semiconductor substrates upon which such devices are fabricated increase in size, and now approach 450 millimeter (mm). As a result, manufacturing processes require increasingly sophisticated unit process and process integration schemes, as well as process and hardware control strategies to ensure the uniform fabrication of devices across the substrate.

For example, during the fabrication of a gate electrode structure in a transistor device, patterning systems and etching systems, which facilitate the formation of the gate structure in a plurality of material films formed on the substrate, are required to achieve and preserve the gate structure critical dimension (CD) vertically within the device being fabricated as well as laterally across the substrate from device-to-device. A reduction of variations in the CD, as well as variations in profile and side-wall angle (SWA), across the substrate can affect the uniform yield of high performance devices (i.e., speed, power consumption, etc.). And, these requirements become only more challenging as the industry shifts from planar gate structures to non-planar gate structures.

The fabrication of integrated circuits (IC) in the semiconductor industry typically employs plasma to create and assist surface chemistry within a processing chamber necessary to remove material from and deposit material on a substrate. In general, plasma is formed within the processing chamber under vacuum conditions by heating electrons in the presence of an electric field to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

In semiconductor manufacturing, numerous techniques exist for creating plasma including, but not limited to, capacitively coupled plasma (CCP) systems, inductively coupled plasma (ICP) systems, electron cyclotron resonance (ECR) plasma systems, helicon wave plasma systems, surface wave plasma systems, slotted plane antenna (SPA) plasma systems, etc. Plasma is formed from the interaction of the supplied process gas with electro-magnetic (EM) field propagation at frequencies in the radio frequency (RF) or microwave spectrum.

However, common to many plasma processing systems, process performance suffers from process non-uniformities, including a spatially non-uniform plasma density. And, this deficiency is further exacerbated with the decreasing size of fabricated devices, the increasing size of the substrate, and the need to obtain greater substrate yield. During an etching process, process non-uniformities may lead to spatial non-uniformities in the distribution of a feature critical dimension (CD) across the substrate or a side-wall angle (SWA) across the substrate. For example, during gate structure formation, it is desirable to achieve a uniform distribution of the gate width (at the top and bottom of the etched feature, as well as the region there between) across the substrate following an etching process or series of etching processes. Failure to achieve uniform or substantially uniform process results leads to a reduction in the yield of high performance devices as indicated above.

Therefore, since improving process uniformity in semiconductor manufacturing has always been an important goal, there remains a need for systems that improve process parameter uniformity across the surfaces of substrates during processing.

SUMMARY OF THE INVENTION

Embodiments of the invention relate to a method for processing a substrate with plasma.

According to one embodiment, a method of treating a substrate with plasma is described. In particular, the method includes disposing a substrate in a plasma processing system, disposing a hollow cathode plasma source including at least one hollow cathode within the plasma processing system, and disposing a grid between the cathode outlet of the plurality of hollow cathodes and the substrate. The method further includes electrically coupling the grid to electrical ground, coupling a voltage to the at least one hollow cathode relative to electrical ground, and generating plasma in hollow cathode by ion-induced secondary electron emission of energetic electrons that move along a first trajectory, and diffusing lower energy electrons along a second trajectory across a first region of the interior space between the cathode outlet and the grid, through the grid, and into a second region of the interior space in fluid contact with the substrate.

According to another embodiment, a method of treating a substrate with plasma is described. The method disposing a substrate in a plasma processing system; disposing a hollow cathode plasma source including a plurality of independently controlled hollow cathodes within the plasma processing system, wherein each hollow cathode defines a plasma discharge space bounded by cathode walls opposing one another about a central axis that intersects a cathode outlet at one end of the hollow cathode allowing fluid communication with an interior space of the plasma processing system; disposing a grid between the cathode outlet of the plurality of hollow cathodes and the substrate; electrically coupling the grid to electrical ground; coupling a voltage to each of the plurality of hollow cathodes relative to the electrical ground, and generating plasma in the plasma discharge space by ion-induced secondary electron emission of energetic electrons that move along a trajectory substantially normal to the central axis; and diffusing lower energy electrons along a trajectory substantially parallel to the central axis across a first region of the interior space between the cathode outlet and the grid, through the grid, and into a second region of the interior space in fluid contact with the substrate.

According to yet another embodiment, a method of treating a substrate with plasma is described. The method includes disposing a substrate in a plasma processing system; disposing a DC (direct current) hollow cathode plasma source including at least one DC hollow cathode within the plasma processing system, the DC hollow cathode defining a plasma discharge space bounded by cathode walls opposing one another about a central axis that intersects a cathode outlet at one end of the hollow cathode allowing fluid communication with an interior space of the plasma processing system; disposing a grid between the cathode outlet of the DC hollow cathode and the substrate; electrically coupling the grid to electrical ground; coupling a negative voltage to the hollow cathode relative to the electrical ground, and generating plasma in the plasma discharge space by ion-induced secondary electron emission of energetic electrons that move along a trajectory substantially normal to the central axis; and diffusing lower energy electrons along a trajectory substantially parallel to the central axis across a first region of the interior space between the cathode outlet and the grid, through the grid, and into a second region of the interior space in fluid contact with the substrate.

DETAILED DESCRIPTION OF SEVERAL EMBODIMENTS

Plasma processing systems and method of operating for treating a substrate, such as a microelectronic workpiece or semiconductor workpiece, are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As briefly described above, plasma processing uniformity is important to achieve adequate yield of advanced devices on large substrates. The systems and methods can allow scaling a plasma processing system in any size or shape, or size and shape. Additionally, the systems and methods can facilitate obtaining a diffusion plasma, and controlling center-to-edge plasma density.

Figure 1:
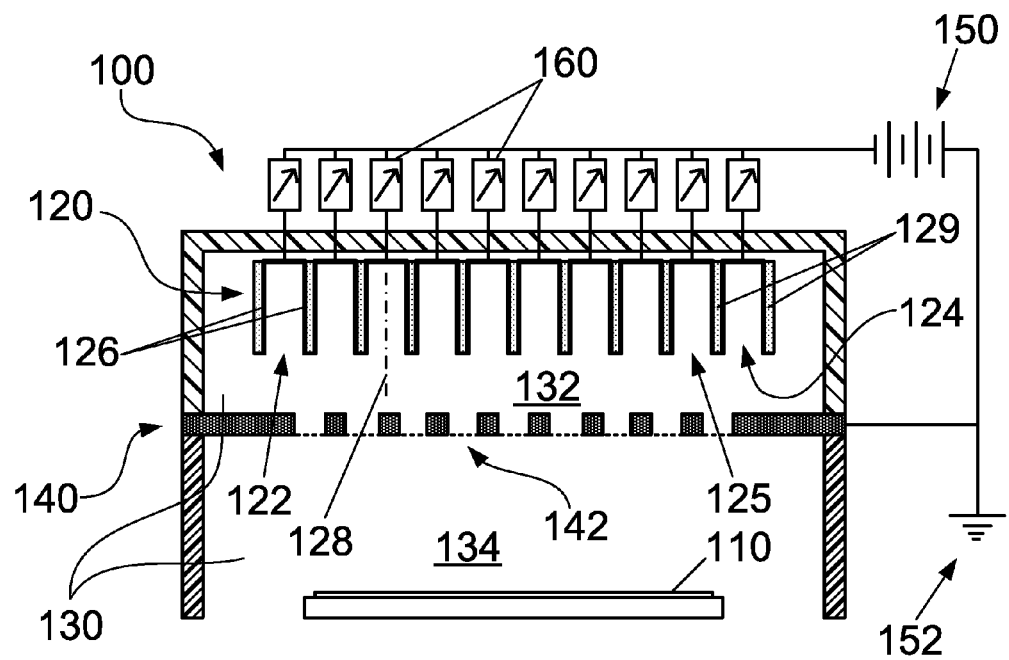
FIG. 1 illustrates a plasma processing system according to an embodiment.

FIG. 1 illustrates a plasma processing system 100 and method of operating according to an embodiment. The plasma processing system 100 generates plasma for treating a substrate 110 using a hollow cathode plasma source 120 including a plurality of independently controlled hollow cathodes 122 within the plasma processing system 100. As shown in FIG. 1, the hollow cathode plasma source 120 can include a DC (direct current) hollow cathode source having a plurality of DC hollow cathodes.

Each hollow cathode 122 defines a plasma discharge space 124 bounded by cathode walls 126 opposing one another about a central axis 128 that intersects a cathode outlet 125 at one end of the hollow cathode 122 allowing fluid communication with an interior space 130 of the plasma processing system 100. Each hollow cathode 122 may be insulated from an adjacent hollow cathode via insulator 129.

Figure 3:
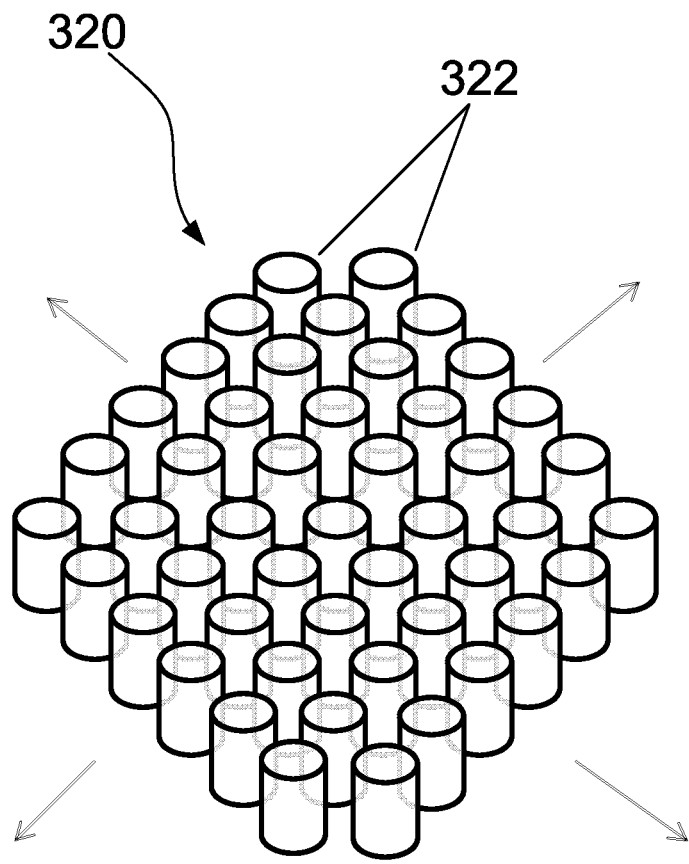
FIG. 3 depicts a hollow cathode source according to yet another embodiment.

FIG. 3 illustrates a hollow cathode plasma source 320 including a plurality of hollow cathodes 322 having a cylindrical shape organized in a two-dimensional array, for example. Alternatively, plurality of hollow cathodes 322 can have a rectangular shape.

The plasma processing system 100 includes a grid 140 between the cathode outlet 125 of the plurality of hollow cathodes 122 and the substrate 110. The grid includes a plurality of openings 142 there through to allow gaseous communication between a first region 132 in an interior space 130 of plasma processing system 100 and a second region 134 in the interior space 130 of plasma processing system 100. The grid 140 may include a dielectric grid, carbon based grid, conductive grid, or metallic grid, and it may be coated with a protective coating. The grid 140 is electrically coupled to electrical ground 152.

A power source 150, such as a DC voltage source, couples a voltage to each of the plurality of hollow cathodes 122 relative to electrical ground 152. The hollow cathode 122 can include a DC hollow cathode, wherein the voltage includes coupling a negative DC voltage to the hollow cathode relative to electrical ground, as shown in FIG. 1. The power source 150 can couple hundreds of volts to a hollow cathode, either continuous or pulsed.

The power source 150 can be used to generate plasma in the plasma discharge space 124 by ion-induced secondary electron emission of energetic electrons that move along a first trajectory. For example, the first trajectory can include a trajectory substantially normal to the central axis 128. As a result of the plasma generation, lower energy electrons move along a second trajectory. For example, the second trajectory can include a trajectory substantially parallel to the central axis 128 across the first region 132 of the interior space 130 between the cathode outlet 125 and the grid 140, through the grid 140, and into the second region 134 of the interior space 130 in fluid contact with the substrate 110.

In plasma processing system 100, high energy electrons, which originate from ion induced secondary emission, are confined mostly within the plasma discharge space 124 of the hollow cathode 122. The high energy electrons oscillate between opposite equal potential surfaces (i.e., cathode walls 126) in a first trajectory substantially perpendicular to the central axis 128 and mainly contribute to the ionization of neutrals. Coincidentally, lower energy electrons can leak towards the ground surface of grid 140 along a second trajectory substantially parallel to the central axis 128. The DC current will be terminated at the ground surface of grid 140 and will not penetrate into the bulk plasma. In this manner, an ambipolar diffusion of DC plasma having low energy can be obtained in the downstream region, or second region 134, of plasma processing system 100.

Each hollow cathode 122 can be powered through an adjustable resistor 160, or similar device, and in doing so, the plasma uniformity and shape can be controlled by adjusting the resistance of the adjustable resistor 160 independently and individually. Center and edge plasma density can be controlled depending on the application.

A spatial uniformity of diffused plasma in the second region 134 of the interior space 130 can be controlled or adjusted by applying a first voltage to a first hollow cathode independently from applying a second voltage to a second hollow cathode, enabled by the arrays of adjustable resistors 160, or similar device. A positive terminal of the DC voltage source 150 can be to DC ground, and a negative terminal of the DC voltage source 150 can be coupled to the first hollow cathode through a first adjustable resistor and to a second hollow cathode through a second adjustable resistor.

Figure 2:
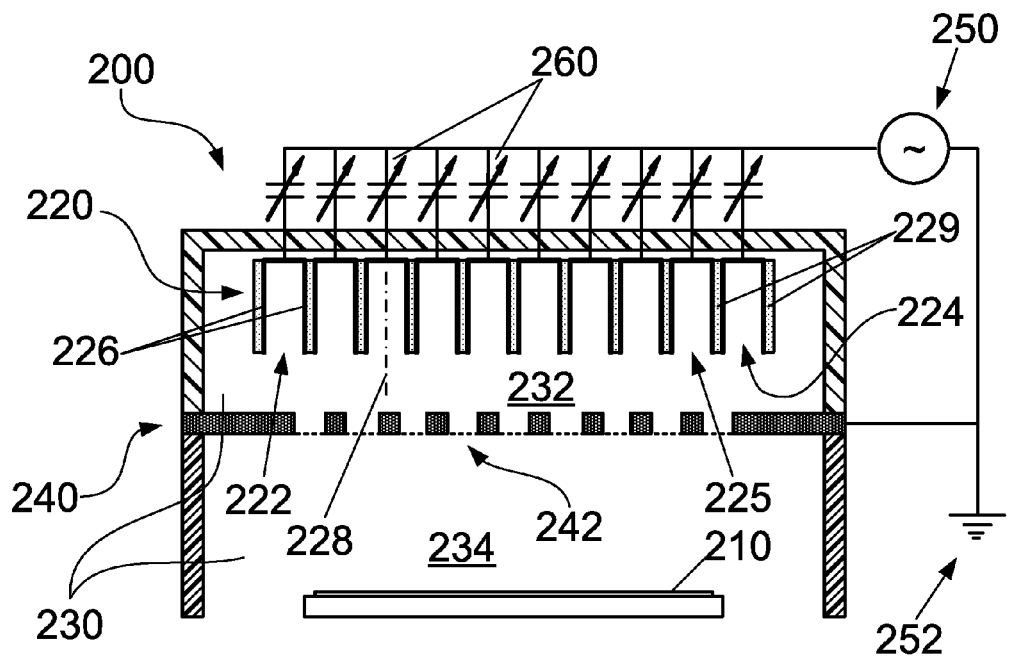
FIG. 2 illustrates a plasma processing system according to another embodiment.

FIG. 2 illustrates a plasma processing system 200 and method of operating according to an embodiment. The plasma processing system 200 generates plasma for treating a substrate 210 using a hollow cathode plasma source 220 including a plurality of independently controlled hollow cathodes 222 within the plasma processing system 200. As shown in FIG. 2, the hollow cathode plasma source 220 can include a RF (radio frequency) hollow cathode source having a plurality of RF hollow cathodes.

Each hollow cathode 222 defines a plasma discharge space 224 bounded by cathode walls 226 opposing one another about a central axis 228 that intersects a cathode outlet 225 at one end of the hollow cathode 222 allowing fluid communication with an interior space 230 of the plasma processing system 200. Each hollow cathode 222 may be insulated from an adjacent hollow cathode via insulator 229.

FIG. 3 illustrates a hollow cathode plasma source 320 including a plurality of hollow cathodes 322 having a cylindrical shape organized in a two-dimensional array, for example. Alternatively, plurality of hollow cathodes 322 can have a rectangular shape.

The plasma processing system 200 includes a grid 240 between the cathode outlet 225 of the plurality of hollow cathodes 222 and the substrate 210. The grid includes a plurality of openings 242 there through to allow gaseous communication between a first region 232 in an interior space 230 of plasma processing system 200 and a second region 234 in the interior space 230 of plasma processing system 200. The grid 240 may include a dielectric grid, carbon based grid, conductive grid, or metallic grid, and it may be coated with a protective coating. The grid 240 is electrically coupled to electrical ground 252.

A power source 250, such as an RF power source, couples a voltage signal to each of the plurality of hollow cathodes 222 relative to electrical ground 252. The hollow cathode 222 can include an RF hollow cathode, wherein the voltage signal includes coupling an RF voltage signal applied to the hollow cathode relative to electrical ground, as shown in FIG. 2. The power source 250 can couple hundreds of volts to a hollow cathode, either continuous or pulsed.

The power source 250 can be used to generate plasma in the plasma discharge space 224 by ion-induced secondary electron emission of energetic electrons that move along a first trajectory. For example, the first trajectory can include a trajectory substantially normal to the central axis 228. As a result of the plasma generation, lower energy electrons move along a second trajectory. For example, the second trajectory can include a trajectory substantially parallel to the central axis 228 across the first region 232 of the interior space 230 between the cathode outlet 225 and the grid 240, through the grid 240, and into the second region 234 of the interior space 230 in fluid contact with the substrate 210.

In plasma processing system 200, high energy electrons, which originate from ion induced secondary emission, are confined mostly within the plasma discharge space 224 of the hollow cathode 222. The high energy electrons oscillate between opposite equal potential surfaces (i.e., cathode walls 226) in a first trajectory substantially perpendicular to the central axis 228 and mainly contribute to the ionization of neutrals. Coincidentally, lower energy electrons can leak towards the ground surface of grid 240 along a second trajectory substantially parallel to the central axis 228. The RF current will be terminated at the ground surface of grid 240 and will not penetrate into the bulk plasma. In this manner, an ambipolar diffusion of RF plasma having low energy can be obtained in the downstream region, or second region 234, of plasma processing system 100.

Each hollow cathode 222 can be powered through an adjustable capacitor 260, or similar device, and in doing so, the plasma uniformity and shape can be controlled by adjusting the capacitance of the adjustable capacitor 260 independently and individually. Center and edge plasma density can be controlled depending on the application.

A spatial uniformity of diffused plasma in the second region 234 of the interior space 230 can be controlled or adjusted by applying a first voltage to a first hollow cathode independently from applying a second voltage to a second hollow cathode, enabled by the arrays of adjustable capacitors 260, or similar device. One terminal of the RF voltage source 250 can be to RF ground, and the other terminal of the RF voltage source 250 can be coupled to the first hollow cathode through a first adjustable capacitor and to a second hollow cathode through a second adjustable capacitor.

According to one embodiment, a method of operating plasma processing system 100, 200 includes: disposing a substrate 110, 210 in a plasma processing system 100, 200; disposing a hollow cathode plasma source 120, 220 including a plurality of independently controlled hollow cathodes 122, 222 within the plasma processing system 100, 200, wherein each hollow cathode 122, 222 defines a plasma discharge space 124, 224 bounded by cathode walls 126, 226 opposing one another about a central axis 128, 228 that intersects a cathode outlet 125, 225 at one end of the hollow cathode allowing fluid communication with an interior space 130, 230 of the plasma processing system 100, 200; disposing a grid 140, 240 between the cathode outlet 125, 225 of the plurality of hollow cathodes 122, 222 and said substrate; electrically coupling the grid 140, 240 to electrical ground 152, 252; coupling a voltage to each of the plurality of hollow cathodes 122, 222 relative to the electrical ground 152, 252, and generating plasma in the plasma discharge space 124, 224 by ion-induced secondary electron emission of energetic electrons that move along a trajectory substantially normal to the central axis 128, 228; and diffusing lower energy electrons along a trajectory substantially parallel to the central axis 128, 228 across a first region 132, 232 of the interior space 130, 230 between the cathode outlet 125, 225 and the grid 140, 240, through the grid 140, 240, and into a second region 134, 234 of the interior space 130, 230 in fluid contact with the substrate 110, 210.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of treating a substrate with plasma, comprising:
    disposing a substrate in a plasma processing system having a power source having a positive terminal and a negative terminal, the positive terminal coupled to ground;
    disposing a hollow cathode plasma source including a plurality of independently controlled hollow cathodes within said plasma processing system, wherein each hollow cathode is coupled to the negative terminal of the power source through a respective adjustable conductive element, wherein each hollow cathode is independently controlled via the respective adjustable conductive element, wherein each hollow cathode defines a plasma discharge space bounded by cathode walls opposing one another about a central axis that intersects a cathode outlet at one end of said hollow cathode allowing fluid communication with an interior space of said plasma processing system;
    disposing a grid between said cathode outlet of said plurality of hollow cathodes and said substrate;
    electrically coupling said grid to electrical ground;
    generating plasma in said plasma discharge space by ion-induced secondary electron emission of energetic electrons that move along a trajectory substantially normal to said central axis; and
    diffusing lower energy electrons along a trajectory substantially parallel to said central axis across a first region of said interior space between said cathode outlet and said grid, through said grid, and into a second region of said interior space in fluid contact with said substrate.

2. The method of claim 1, wherein said hollow cathode is a DC (direct current) hollow cathode, and said power source is a DC voltage source providing a negative DC voltage through the negative terminal.

3. The method of claim 2, further comprising:
    altering a spatial uniformity of diffused plasma in said second region of said interior space by applying a first voltage to a first hollow cathode independently from applying a second voltage to a second hollow cathode.

4. The method of claim 1, wherein said hollow cathode is a RF (radio frequency) hollow cathode, and said power source is a RF power source providing a negative RF power through the negative terminal.

5. The method of claim 4, further comprising:
    altering a spatial uniformity of diffused plasma in said second region of said interior space by applying a first voltage signal to a first hollow cathode independently from applying a second voltage signal to a second hollow cathode.

6. The method according to claim 1, wherein the plurality of hollow cathodes are arranged as a two-dimensional array.

7. The method according to claim 1, wherein each hollow cathode is cylindrical.

8. The method according to claim 7, wherein a circumference of each cylindrical hollow cathode is the same along the central axis.

9. The method according to claim 1, wherein each respective adjustable conductive element is an adjustable resistor.

10. The method according to claim 1, wherein each respective adjustable conductive element is an adjustable capacitor.

11. The method according to claim 1, wherein each hollow cathode is cylindrical having a same diameter extending along the central axis from an end that intersects the cathode outline to an end that is coupled to the respective adjustable conductive element.

12. A method of treating a substrate with plasma, comprising:
    disposing a substrate in a plasma processing system having a power source having a positive terminal and a negative terminal, the positive terminal coupled to ground;
    disposing a DC (direct current) hollow cathode plasma source including a plurality of DC hollow cathodes within said plasma processing system, each DC hollow cathode coupled to the negative terminal of the power source through a respective adjustable conductive element, each DC hollow cathode independently controlled via the respective adjustable conductive element, each DC hollow cathode defining a plasma discharge space bounded by cathode walls opposing one another about a central axis that intersects a cathode outlet at one end of said hollow cathode allowing fluid communication with an interior space of said plasma processing system;
    disposing a grid between said cathode outlet of said plurality of DC hollow cathodes and said substrate;
    electrically coupling said grid to electrical ground;
    generating plasma in said plasma discharge space by ion-induced secondary electron emission of energetic electrons that move along a trajectory substantially normal to said central axis; and
    diffusing lower energy electrons along a trajectory substantially parallel to said central axis across a first region of said interior space between said cathode outlet and said grid, through said grid, and into a second region of said interior space in fluid contact with said substrate.

13. The method of claim 12, further comprising:
    altering a spatial uniformity of diffused plasma in said second region of said interior space by applying a first voltage signal to a first hollow cathode independently from applying a second voltage signal to a second hollow cathode.

14. A method of treating a substrate with plasma, comprising:
    disposing a substrate in a plasma processing system having a power source having a positive terminal and a negative terminal, the positive terminal coupled to ground;
    disposing a radio frequency (RF) hollow cathode plasma source including a plurality of RF hollow cathodes within said plasma processing system, each RF hollow cathode coupled to the negative terminal of the power source through a respective adjustable conductive element, each RF hollow cathode independently controlled via the respective adjustable conductive element, each RF hollow cathode defining a plasma discharge space bounded by cathode walls opposing one another about a central axis that intersects a cathode outlet at one end of said hollow cathode allowing fluid communication with an interior space of said plasma processing system;
    disposing a grid between said cathode outlet of said plurality of RF hollow cathodes and said substrate;
    electrically coupling said grid to electrical ground;
    generating plasma in said plasma discharge space by ion-induced secondary electron emission of energetic electrons that move along a trajectory substantially normal to said central axis; and
    diffusing lower energy electrons along a trajectory substantially parallel to said central axis across a first region of said interior space between said cathode outlet and said grid, through said grid, and into a second region of said interior space in fluid contact with said substrate.

15. The method of claim 14, further comprising:
    altering a spatial uniformity of diffused plasma in said second region of said interior space by applying a first voltage signal to a first hollow cathode independently from applying a second voltage signal to a second hollow cathode.

* * * * *